United States Patent [19]
Joseph et al.

[11] Patent Number: 5,907,777
[45] Date of Patent: May 25, 1999

[54] METHOD FOR FORMING FIELD EFFECT TRANSISTORS HAVING DIFFERENT THRESHOLD VOLTAGES AND DEVICES FORMED THEREBY

[75] Inventors: Thomas W. Joseph, Wappingers Falls; Christopher C. Parks, Beacon, both of N.Y.

[73] Assignee: International Business Machines Corporation, Armonk, N.Y.

[21] Appl. No.: 08/903,671

[22] Filed: Jul. 31, 1997

[51] Int. Cl.⁶ .................................. H01L 21/8234
[52] U.S. Cl. ............................. 438/275; 438/308
[58] Field of Search ............................. 438/275, 195, 438/197, 205, 207, 216, 283, 286, 287, 288, 340, 376, 308

[56] References Cited

U.S. PATENT DOCUMENTS

| | | | |
|---|---|---|---|
| Re. 31,079 | 11/1982 | Nagasawa et al. | 29/571 |
| 4,043,848 | 8/1977 | Bazin | 148/187 |
| 4,329,186 | 5/1982 | Kotecha et al. | 148/1.5 |
| 4,420,872 | 12/1983 | Solo de Zaldivar | 29/571 |
| 4,600,933 | 7/1986 | Richman | 357/23.12 |
| 4,677,739 | 7/1987 | Doering et al. | 29/576 B |
| 4,745,083 | 5/1988 | Huie | 437/45 |
| 4,786,611 | 11/1988 | Pfiester | 437/45 |
| 4,806,500 | 2/1989 | Scheibe | 437/57 |
| 5,223,456 | 6/1993 | Malwah . | |
| 5,234,853 | 8/1993 | Ikemasu . | |
| 5,405,788 | 4/1995 | Manning et al. | 437/29 |
| 5,532,175 | 7/1996 | Racanelli et al. | 437/29 |
| 5,552,332 | 9/1996 | Tseng et al. . | |
| 5,811,337 | 2/1997 | Wen . | |

*Primary Examiner*—Richard A. Booth
*Assistant Examiner*—Jonathan Hack
*Attorney, Agent, or Firm*—Schmeiser, Olsen & Watts; Daniel Schnurmann

[57] ABSTRACT

The preferred embodiment provides a method for fabricating field effect transistors that have different threshold voltages without requiring excessive masking and other fabrication steps. In particular, the method facilitates the formation of FETs with different threshold voltages by doping the gate dielectric with various amounts of ions. This provides a built in potential in the gate dielectric proportional to the amount of ions in the gate dielectric. This potential changes the threshold voltage of the FET. Thus, by selectively doping the gate dielectric with ions the threshold voltage of a FET can be changed. The selective doping of many FETs to many different threshold voltages can be done with only one additional masking step. Thus, the present invention provides the ability to form FETs having different threshold voltages without requiring excessive process complexity.

21 Claims, 7 Drawing Sheets

METHOD FOR FORMING FIELD EFFECT
TRANSISTORS HAVING DIFFERENT
THRESHOLD VOLTAGES AND DEVICES
FORMED THEREBY

BACKGROUND OF THE INVENTION

1. TECHNICAL FIELD

The present invention relates generally to the field of semi-conductor manufacturing and, more specifically, to a method for forming field effect transistors with selective threshold voltages.

2. BACKGROUND ART

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in the design and fabrication of field effect transistors (FETs), such as those used in CMOS technologies. FETs are used in almost all types of integrated circuit design (i.e., microprocessors, memory, etc.) One of the fundamental parameters of the FET design is the threshold voltage ($V_T$). The threshold voltage of a FET is defined as the gate voltage required to switch the transistor on or off depending on the type of transistor. In particular, enhancement mode FETs are normally off until a voltage equal to the threshold voltage is applied to the gate, forming a conducting channel under the gate which turns on the FET. By contrast, depletion mode FETs are normally on until a voltage equal to the threshold voltage (usually a negative voltage) is applied to gate which depletes the conductive channel and turns the FET off. In either case the threshold voltage of the FET is a important parameter and significantly controls the behavior of the FET.

Most integrated devices made today include thousands, if not millions of FETs on a single chip. In many cases it is desirable to make the individual FETs on a chip have different threshold voltages such that the different FETs switch at different times. Additionally, it is desirable to be able to change FET's from enhancement mode to depletion mode and vice versa to give additional flexibility to device designers.

The threshold voltage of a FET is determined primarily by the implant dose in the channel and the gate dielectric thickness. Present methods for providing FETs with different threshold voltages on the same chip require a different masking step followed by a specialized channel implant for each different threshold voltage desired. Thus, a chip that requires FETs with five different threshold voltages requires five different masking steps, each followed by a specialized implant of varying dose and energy designed to adjust the threshold voltage. This greatly increases the process complexity with the attending problems, all of which serve to drive chip yield down and costs up.

Thus, there was a need for an improved method for fabricating field effect transistors with varying threshold voltages that does not require excessive masking steps.

DISCLOSURE OF INVENTION

Accordingly, the present invention provides a method for fabricating field effect transistors that have different threshold voltages without requiring excessive masking and other fabrication steps. In particular, the method facilitates the formation of FETs with different threshold voltages by doping the gate dielectric with various amounts of ions. This provides a built in potential in the gate dielectric proportional to the amount of ions in the gate dielectric. This potential changes the threshold voltage of the FET. Thus, by selectively doping the gate dielectric with ions the threshold voltage of a FET can be changed. The selective doping of many FETs to many different threshold voltages can be done with only one additional masking step. Thus, the present invention provides the ability to form FETs having different threshold voltages without requiring excessive process complexity.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention overcomes the limitations of the prior art and provides a method for fabricating field effect transistors that have different threshold voltages without requiring excessive masking and other fabrication steps. The preferred embodiment provides FETs with different threshold voltages by selectively doping the gate dielectric with ions. This provides a built in potential in the gate dielectric proportional to the amount of ions in the gate dielectric. This potential changes the amount of voltage that must be externally applied to turn on or turn off the transistor. Thus, by selectively doping the gate dielectric with ions the threshold voltage of a FET can be changed. The selective doping of many FETs to many different threshold voltages can be done with only one additional masking step.

In particular, if positive charge ions are added to an enhancement mode FET, the amount of externally applied bias required to turn on the device decreases. Likewise, if negative charge ions are added to an enhancement mode FET, the amount of externally applied bias required to turn on the device increases. For a depletion mode transistor, adding negative charge ions increases the amount of externally applied negative bias that is required to turn off the transistor, while adding positive charge ions would decrease the charge required. Thus, by selecting an appropriate negative or positive ion, and doping the gate dielectric with that ion, the threshold voltage for any type of transistor can be modified.

It should also be noted that if sufficient ions are added to the gate dielectric of a transistor, the transistor can be switched from operating as an enhancement mode transistor to a depletion mode transistor and vice versa. For example, if enough positive ions are added to an enhancement mode transistor, the amount of externally applied bias required to turn on the transistor would drop to below zero. This would make the transistor always on unless a further negative charge is applied, and thus the transistor would then behave as a depletion mode transistor.

The ions selected for use are preferably mobile ions, where mobile ions can move throughout a chosen medium when subjected to increased temperature and/or electrical bias. Examples of ions that could be used include the alkali earth metals such as sodium (Na), potassium (K), rubidium (Rb), and cesium (Cs). Other ions, such as fluorine (F) could also be used.

Figure 1:
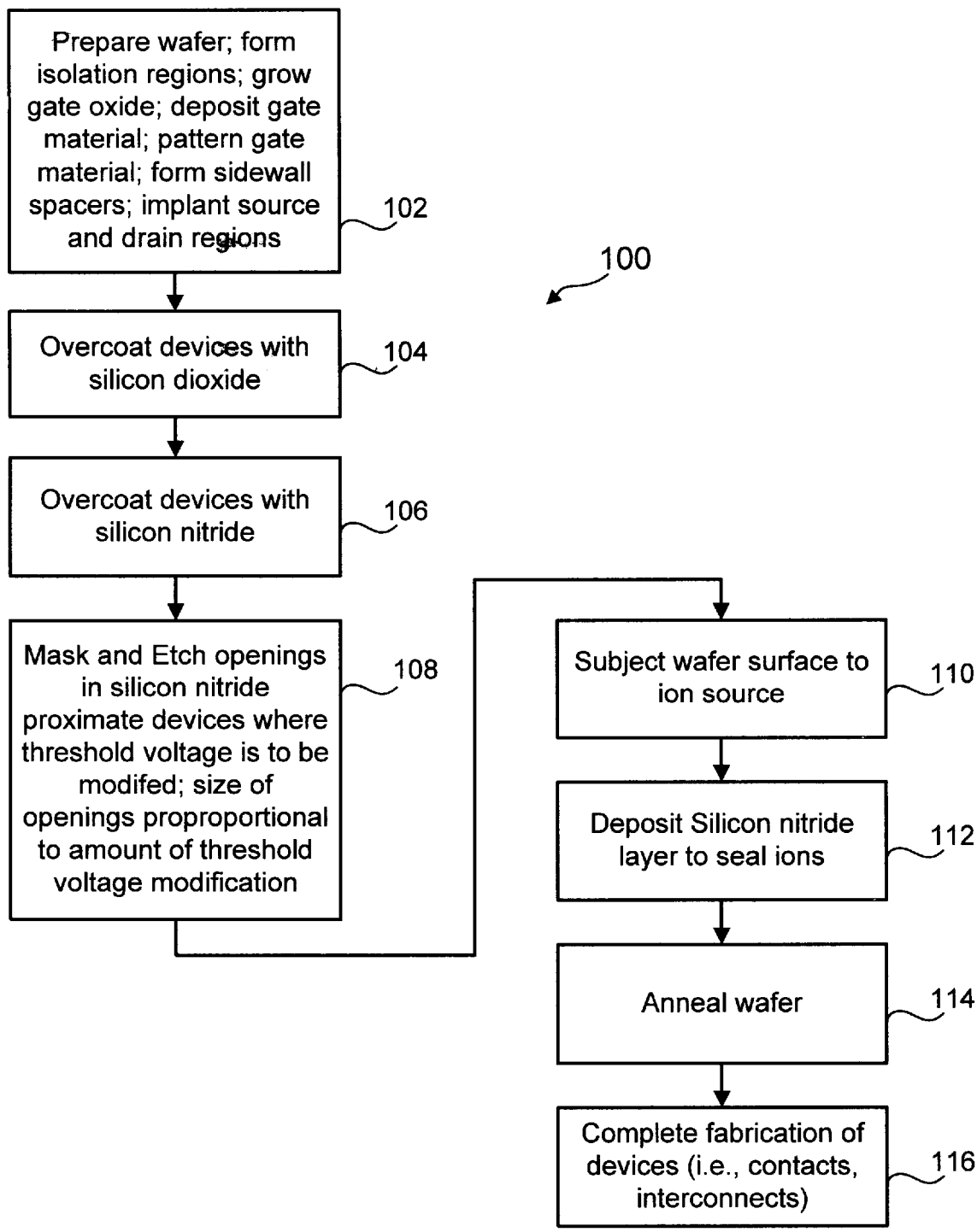
FIG. 1 is a flow diagram illustrating a method for producing transistors in accordance with the preferred embodiment.

Turning to FIG. 1, a method 100 for fabricating a semiconductor wafer that has FETs with varying threshold voltages is shown. The method is compatible with traditional methods of fabricating field effect transistors, with only minor changes required to facilitate the formation of FETs with different threshold voltages.

The first step 102 is to form the field effect transistors. Many different methods for forming field effect transistors are known in the art. As an example of a suitable method, a semiconductor wafer is first cleaned and prepared. Next, isolation regions (such as shallow trench isolation) are formed in between the active areas. Gate oxide is then grown and gate material (such as polysilicon) is then deposited on the gate material. The gate material and gate oxide is then patterned using a suitable photolithographic method. Sidewall spacers are then formed, typically by conformally depositing or growing a dielectric such as silicon dioxide, followed by a directional etch that removes the dielectric from the horizontal surfaces while leaving it on the sidewalls of then gates. The source and drain regions are then selectively doped using a suitable implant technique.

These procedures form the basic elements of the field effect transistor. Of course, other methods to form these basic elements can be used with the preferred method of forming FETs with different threshold voltages.

Figure 2:
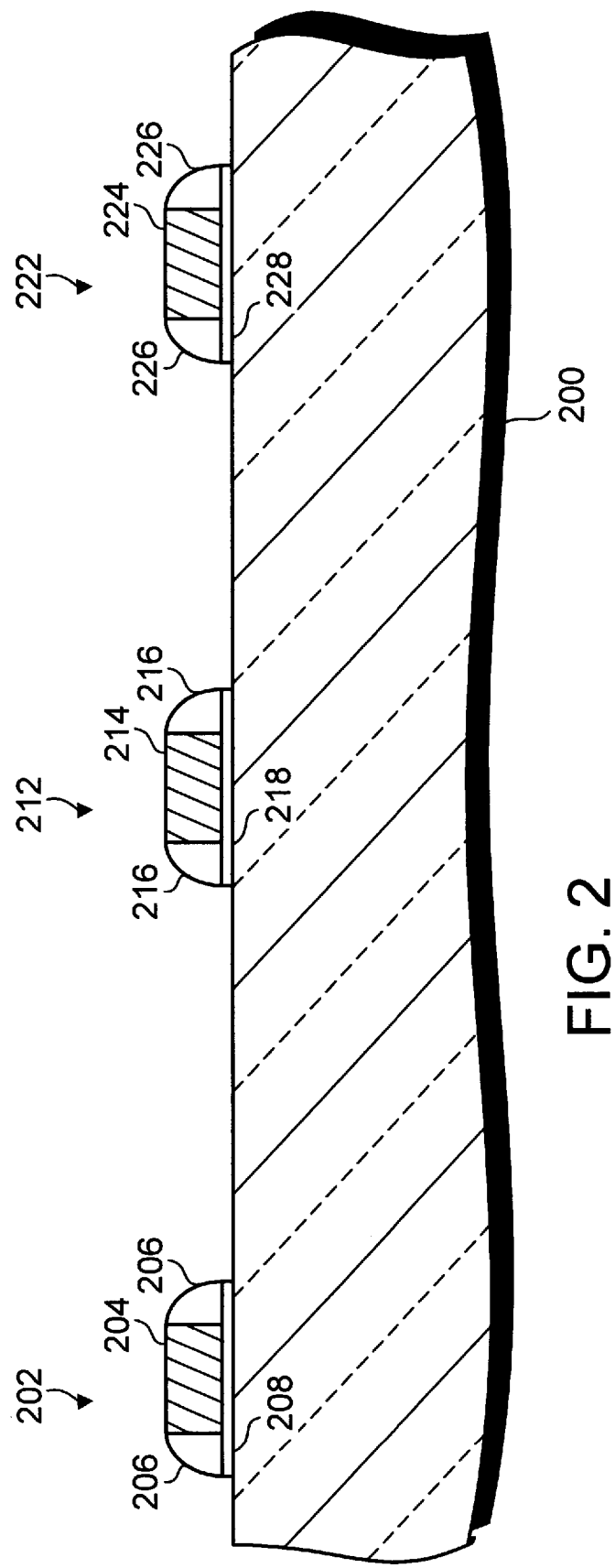
FIGS. 2–7 are cross sectional views of a semiconductor portion in various stages of fabrication containing FETs with different threshold voltages in accordance with the preferred embodiments.

The next step 104 in the preferred embodiment is to deposit a layer of silicon dioxide over the field effect transistors. The silicon dioxide will serve as an ion transport layer allowing ions to migrate to the gate dielectric. Of course, other suitable materials in which ions can migrate can be used. For example, fluorine or nitrogen containing oxides could be used. Additionally, sidewall spacers can be used a the silicon transport layer where they comprise a suitable material. Turning to FIG. 2, a cross sectional view of a wafer portion 200 is shown illustrating three FETs 202, 212, and 222 being formed. For clarity purposes, FIG. 2 illustrates only the gate, gate oxide and sidewall spacers of each FET, with the source and drain regions and any isolation not shown. In particular, FIG. 2, illustrates a FET 202 comprising a gate 204, sidewall spacers 206, and gate oxide 208. Likewise, FET 212 comprises a gate 214, sidewall spacers 216 and gate oxide 218 while FET 222 comprises a gate 224, sidewall spacers 226, and gate oxide 228.

Figure 3:
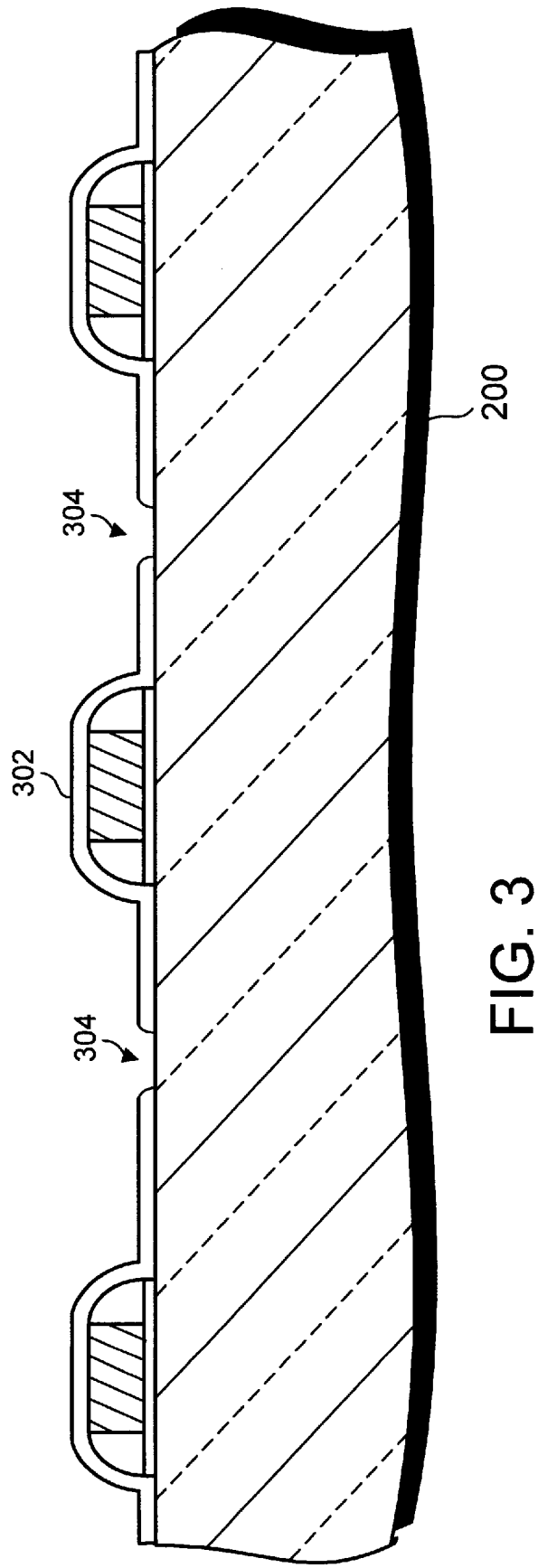

Turning to FIG. 3, the wafer portion 200 is shown with a silicon dioxide layer 302 deposited on the FETs. The silicon dioxide layer 302 serves as an ion transport layer, providing a path for mobile ions to migrate to the gate oxide. In the preferred embodiment the silicon dioxide layer 302 is thinned or removed at locations 304 between the FETs to prevent ions from migrating between devices. This can be done by a suitable mask and etch step (either a separate step or a mask and etch also used to form other openings such as contact openings) or other suitable methods.

Returning to the method 100, the next step 106 is to deposit a layer of silicon nitride over the silicon dioxide layer. The silicon nitride serves as an ion block during ion migration. Of course, other suitable materials that block ion migration can be used such as polysilicon, metals, or silicide.

The next step 108 is to selectively form openings in the silicon nitride near transistors that are to have their threshold voltage selectively modified. In particular, openings are preferably etched with a size that is proportional to the amount of threshold voltage modification desired in the nearby transistor. The etching is preferably done by depositing and patterning photoresist, and then etching the silicon nitride through the photoresist openings. The remaining resist is then removed (although the resist can be left until after the ion transport layer has been doped with ions).

Figure 4:
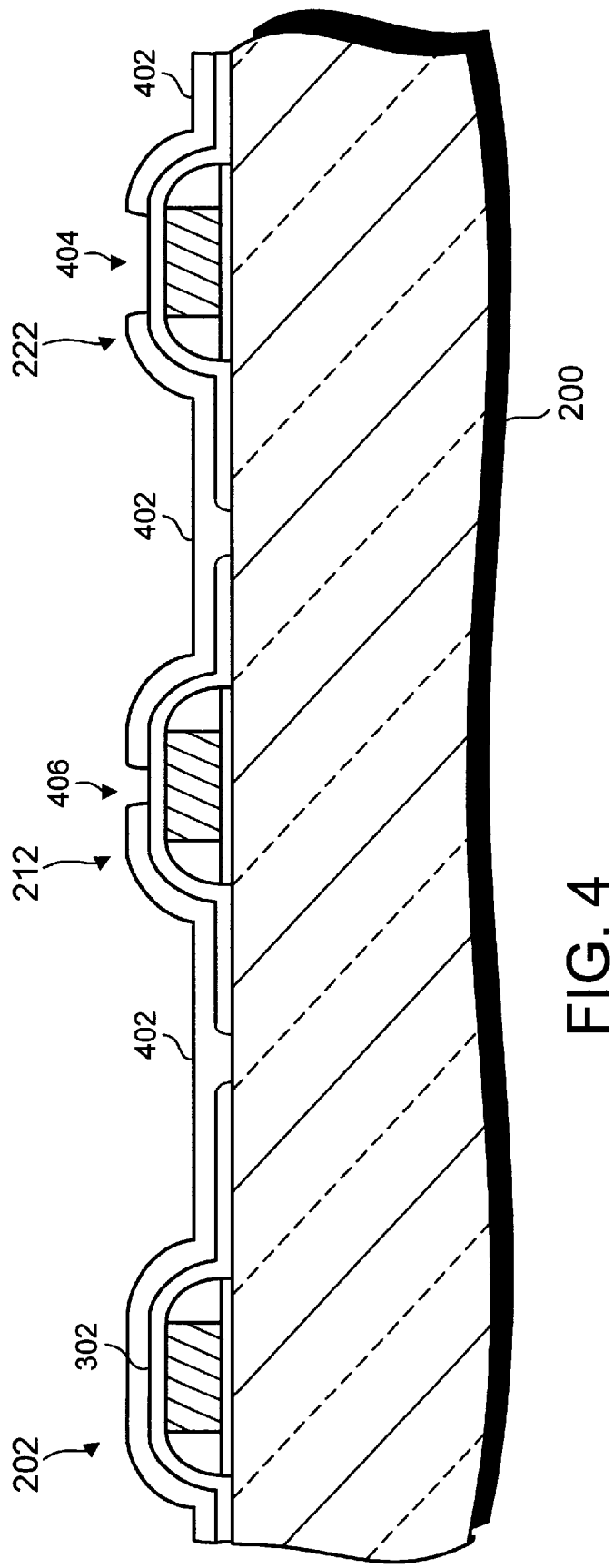

Turning to FIG. 4, the wafer portion 200 is illustrated with an ion blocking silicon nitride layer 402 deposited on the silicon dioxide layer. Openings 404 and 406 are created in the silicon nitride layer 402 such that the silicon dioxide layer 302 is exposed beneath. The size of the openings is preferably proportional to the amount of threshold voltage modification desired in a transistor.

The next step 110 is to dope the silicon dioxide layer with ions through the openings in the silicon nitride layer. There are several ways of subjecting the wafer surface to an ion source such that the silicon dioxide layer is doped with ions. The preferred method for doping the silicone dioxide layer with ions is to perform an ion implantation that drives the ion in the exposed part of the silicon dioxide layer.

This ion implantation can be done with the photoresist from the last step remaining or after it has been removed. The ions are implanted with a density and energy selected to achieve a desired threshold voltage modification. For example, the ions can be implanted at a dose of about 1E12 ions/cm$^2$ and an energy of 30–70 keV.

A second method for doping the silicon dioxide with ions is to immerse or spray the wafer with a solution containing ions. For example, an aqueous solution can be applied to the wafer surface having 100 ppm of ions for approximately five minutes. The wafer is the cleaned using deionized water. A mild thermal heat anneal then applied to cause the ions to diffuse from the surface and into the silicon dioxide.

A third method for doping the silicon dioxide with ions is to deposit a layer that serves as an ion source. For example, a sodium doped layer is deposited over the wafer. A anneal is then used to cause the ions to migrate into the silicon dioxide.

In any case, the amount of ions that are doped into the silicon dioxide layer is partially determined by the size of the opening in the silicon nitride layer.

Figure 5:
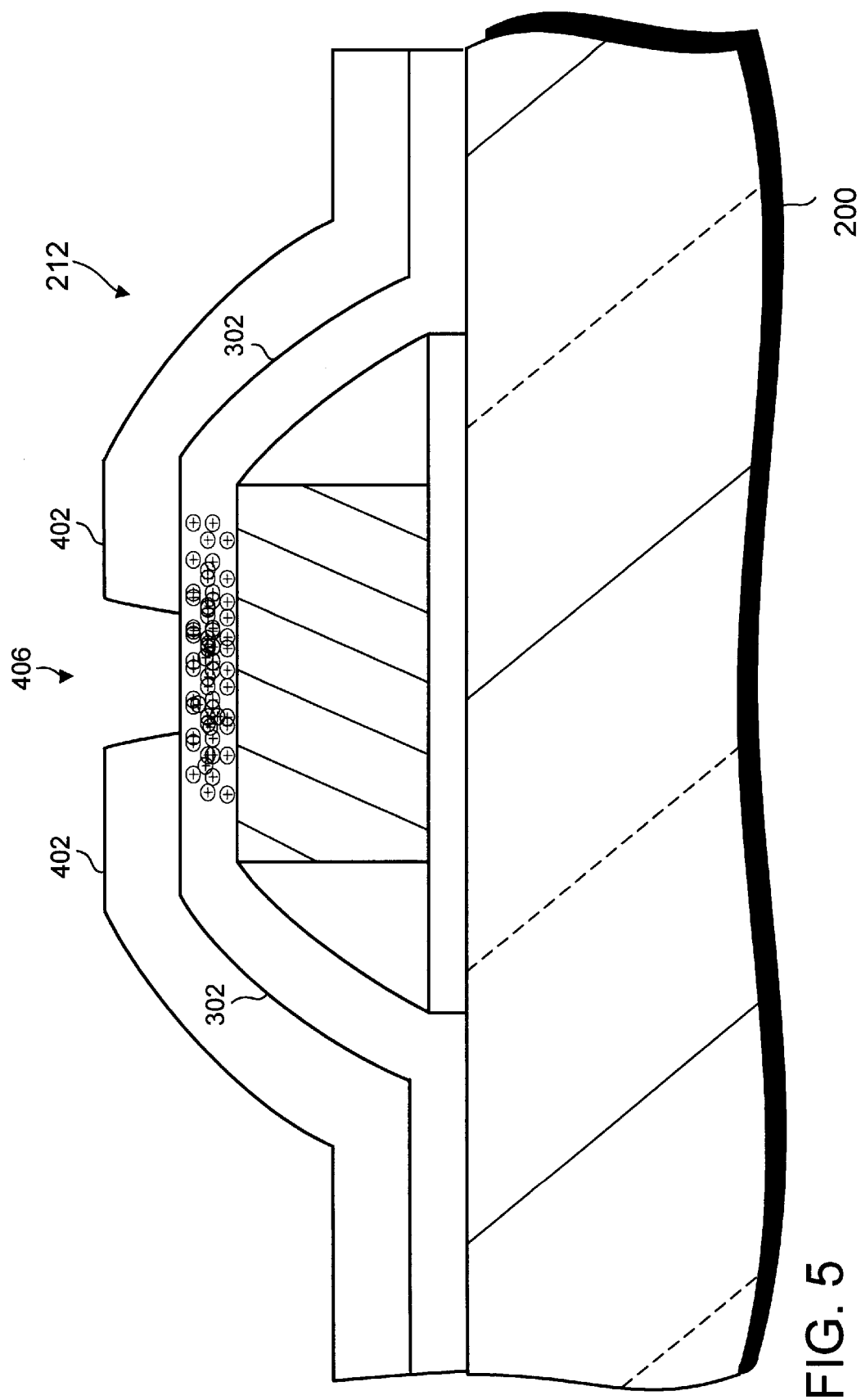

Turning to FIG. 5, a close up of transistor 212 on wafer portion 200 is illustrated. Doping the silicon dioxide layer 302 with ions has caused ions to become embedded in the silicon dioxide layer 302 in areas proximate the opening 406 in silicon nitride layer 402. Because silicon nitride layer 402 blocks the ions, ions will not be doped into portions of the silicon dioxide not proximate to the silicon nitride openings. Thus, no ions will be doped in the silicon dioxide proximate to transistor 202 (FIG. 4). Some ions will be doped into the silicon dioxide proximate transistor 212 through opening 406 and more ions will be doped into the silicon dioxide proximate transistor 222 through opening 408 (not shown in FIG. 5).

Figure 6:
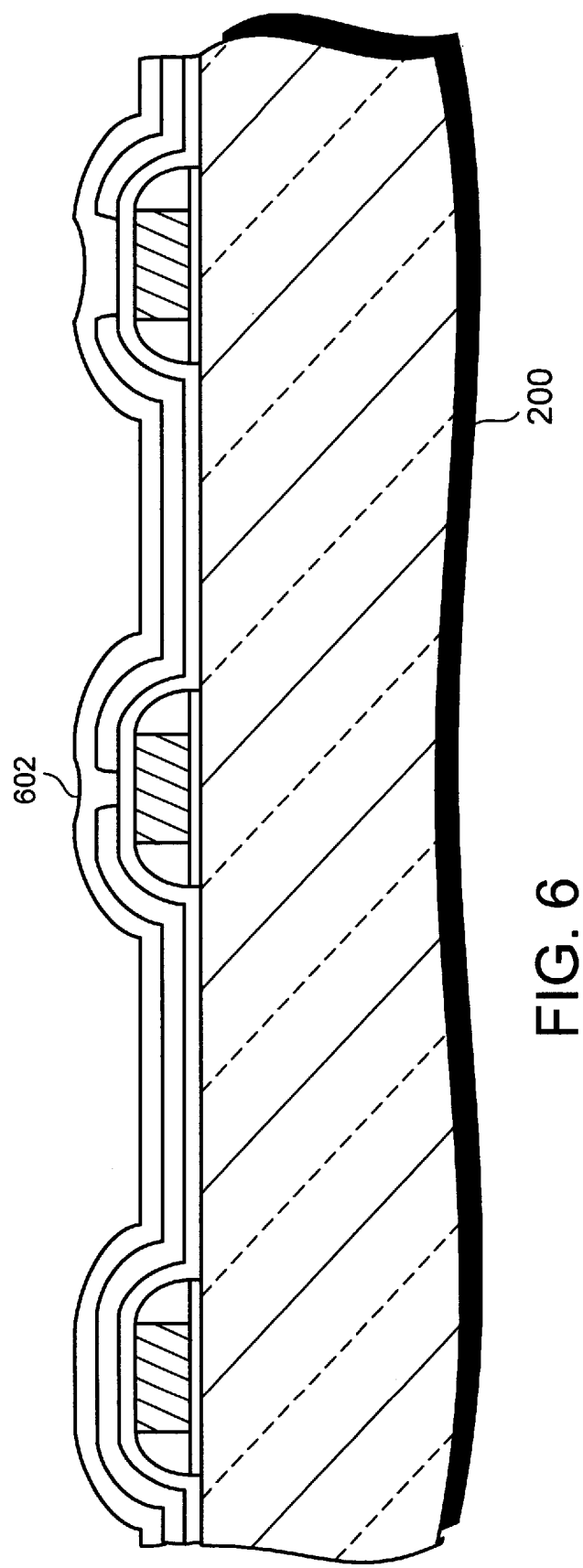

The next step 112 is to deposit a ion blocking cap layer. The ion blocking cap layer preferably comprises silicon nitride to prevent the ions from migrating out of the silicon dioxide layer during later processing steps. Other materials could be used to seal in the ions, such as the silicide, polysilicon or metals. If the ions were not sealed in the silicon dioxide layer it would be difficult to control how much doping reaches the gate oxide. Additionally, the ions could get out and contaminate other devices on the wafer during later processing steps (e.g., annealing, metalization, etc.) Turning to FIG. 6, the wafer portion 200 is shown with a silicon nitride cap layer 602 deposited over the wafer.

The next step 114 is to anneal the wafer. Annealing the wafer causes the ions to migrate through the materials that are conductive to ion migration. In particular, the ions will migrate through the silicon dioxide layer and into the adjacent gate oxide. The ions will not migrate into areas that are not conductive to ion migration, such as the polysilicon gate material and the silicon nitride regions. The ions could migrate through the sidewall spacers where the sidewall spacers comprises silicon oxide, but in many cases this is prevented by a silicon nitride layer that covers the outside of the sidewall spacer.

In the preferred embodiment, the wafer is annealed at 200 to 300 degrees Celsius for 30 to 60 minutes. It should be noted that in many fabrication processing methods annealing occurs at later steps, such as when interconnects are formed. These later anneals can be used to migrate the ions to the gate dioxide and thus a separate annealing step will not be required.

Figure 7:
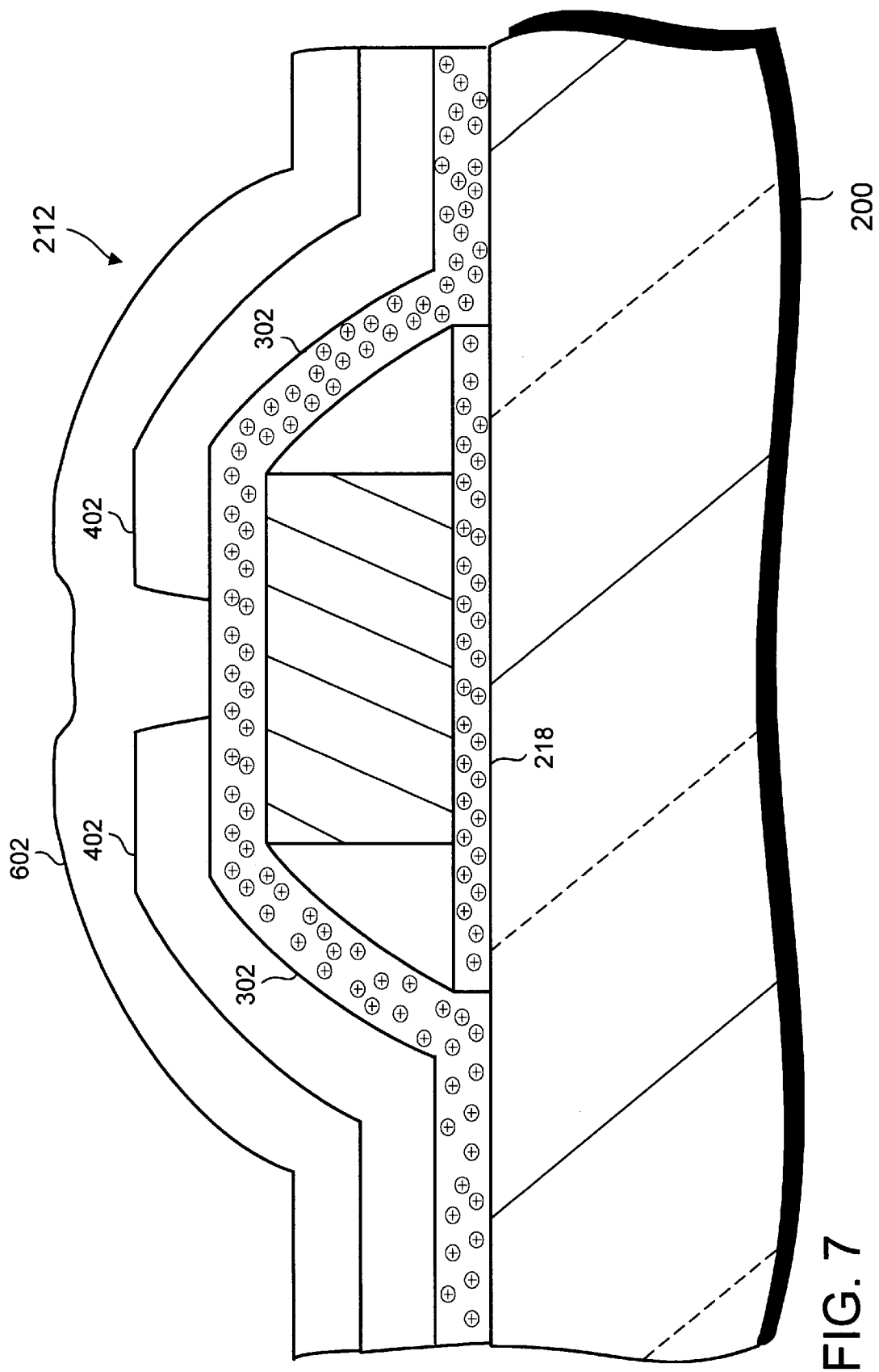

Turning to FIG. 7, a close up of transistor 212 on wafer portion 200 is illustrated with the ions having migrated through the silicon dioxide layer 302 and into the adjacent gate oxide 218. The resulting density of ions which migrate into the gate dielectric layer 218 determines the amount of threshold voltage modification from the intrinsic threshold voltage. Similar ion migration will occur into the gate oxide 228 of transistor 222, although in that case the resulting density of ions in the gate oxide 228 will be greater because of the greater number of ions initially doped into the silicon dioxide proximate transistor 222. This will cause a proportional greater modification in the threshold voltage of transistor 222. Conversely, because no ions were doped into the silicon dioxide proximate transistor 212, the threshold voltage of transistor 212 remains at its intrinsic level.

The next step 116 is to complete the fabrication of the devices. This typically includes the formation of interconnects and wiring of the devices on the wafer, and final packaging.

In another preferred embodiment, trapping sites are used to help keep the ions from leaving the gate dielectric. As discussed above, mobile ions have the tendency to migrate when the wafer temperature is increased. This can lead to problems where later processing requires high wafer temperatures. In particular, the high temperature can cause the mobile ions to migrate out of the gate dielectric and to other devices, where they can have undesirable effects. Additionally, similar migration can be caused by the application of electrical bias.

Trapping sites are used in the preferred embodiment to prevent the ions from leaving the gate dielectric. Trapping sites are preferably formed by fabricating the gate dielectric in a gas that contains the desired trapping material. For example, silicon oxide can be grown in a gas that contains chlorine. This causes the gate oxide to contain a distribution of chlorine, as is well known in the art. The amount of chlorine in the gate oxide is proportional to exact gas mixture, and in particular, the amount of chlorine present in the ambient during oxide growth. Additionally, there are known methods to control the distribution of chlorine in the gate oxide.

In some cases the addition of trapping sites which comprise chlorine can alter the threshold voltage of the FETs. In this case however, all the FETs would be affected in the same proportional amount. The device design used would take into account any resulting threshold voltage change and compensate the design of all transistors accordingly.

When the mobile ions migrate into the gate dielectric layer during annealing, they are trapped by the trapping site elements. For example, when a sodium ion comes in contact with a chlorine trapping site, they are attracted together by coulomb forces and form a bound pair. Thus, when the chlorine comes in contact with the sodium ion it will immobilize the sodium ion, and function as a trapping site for the sodium ion.

Preferably the number of trapping sites in the gate dielectric is sufficient to trap all the mobile ions that migrate into the gate dielectric. The trapping site element is preferably selected to bond with the mobile ions being used.

Thus, the preferred embodiment provides a method for selectively varying the threshold voltage of transistors without requiring excessive processing steps or other process complexity. The preferred embodiment can be used in virtually any fabrication technology with limited modification.

One possible application for this technique would be to use FETs with manipulated threshold voltages as memory array elements in a read only memory (ROM) design. In particular, the FETs would be fabricated as enhancement mode transistors and then a portion of the FETs modified to be depletion mode FETs (or vice versa). The disparate electrical performance between enhancement mode transistor and depletion mode transistors would be used to indicate zero's and one's. Thus, a single FET can be used as the ROM memory element.

While the invention has been particularly shown and described with reference to an exemplary embodiment using field effect transistors, those skilled in the art will recognize that the preferred embodiment can be applied to other applications, and that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

We claim:

1. A method for forming a plurality of transistors with different threshold voltages, the method comprising the steps of:
    a) forming a plurality of gate dielectrics on a semiconductor substrate;
    b) forming a plurality of gates on said plurality of gate dielectrics;
    c) depositing a mobile ion transport layer over said plurality of gates;
    d) depositing a mobile ion blocking layer over said mobile ion transport layer;
    e) forming a plurality of openings in said mobile ion blocking layer proximate the gate dielectric of the transistors in which the threshold voltage is to be modified, the size of said plurality of openings proportionate to the amount of threshold voltage modification desired;

f) doping the mobile ion transport layer with mobile ions through the plurality of openings; and g) annealing said semiconductor substrate causing said mobile ions to migrate to said plurality of gate dielectrics proximate said plurality of openings in said mobile ion blocking layer.

2. The method of claim 1 wherein the step of doping said mobile ion transport layer comprises implanting ions into said mobile ion transport layer.

3. The method of claim 1 wherein the step of doping said mobile ion transport layer comprises subjecting said mobile ion transport layer to a solution containing mobile ions.

4. The method of claim 3 wherein the step of doping said mobile ion transport layer further comprises the step of annealing said semiconductor substrate after subjecting said mobile ion transport layer to said solution containing mobile ions.

5. The method of claim 1 wherein the step of doping said mobile ion transport layer comprises depositing a layer containing mobile ions over said mobile ion transport layer openings and annealing said semiconductor substrate.

6. The method of claim 1 wherein the mobile ions comprise sodium ions.

7. The method of claim 1 wherein the mobile ion transport layer comprises silicon dioxide.

8. The method of claim 1 wherein the mobile ion blocking layer comprises silicon nitride.

9. The method of claim 1 further comprising the step of depositing a mobile ion blocking cap layer over said openings in said mobile ion blocking layer.

10. The method of claim 1 wherein the step of forming a mobile ion transport layer comprises the step of forming breaks in said mobile ion transport layer between transistors.

11. The method of claim 1 wherein the step of forming a mobile ion transport layer comprises the step of forming sidewall spacers on said plurality of gates.

12. The method of claim 1 wherein the step of forming a plurality of gate dielectrics on a semiconductor substrate comprises the step of forming a plurality of trapping sites in said plurality of gate dielectrics, said trapping sites bonding with said mobile ions.

13. The method of claim 12 wherein said trapping sites comprises chlorine.

14. The method of claim 12 wherein said transistor gate material comprises polysilicon.

15. A method for forming a plurality of transistors with different threshold voltages, the method comprising the steps of:

a) providing a semiconductor substrate;

b) forming a plurality of gate dielectrics on a semiconductor substrate, each of said plurality of gate dielectrics including a plurality of trapping sites;

c) forming a plurality of gates on said plurality of gate dielectrics;

d) depositing a silicon dioxide mobile ion transport layer over said plurality of gates;

e) depositing a silicon nitride mobile ion blocking layer over said mobile ion transport layer;

f) etching a plurality of openings in said silicon nitride mobile ion blocking layer proximate the gate dielectric of the transistors in which the threshold voltage is to be modified, the size of each of said plurality of openings proportionate to the amount of threshold voltage modification desired;

g) doping the mobile ion transport layer with mobile ions through the plurality of openings;

h) depositing a silicon nitride cap layer over said plurality of openings; and i) annealing said semiconductor substrate such that said mobile ions migrate to said plurality of gate dielectrics proximate said plurality of openings in said mobile ion blocking layer, wherein said mobile ions are trapped in said plurality of gate dielectrics by said plurality of trapping sites.

16. The method of claim 15 wherein the step of doping said mobile ion transport layer comprises subjecting said mobile ion transport layer to a solution containing mobile ions.

17. The method of claim 16 wherein the step of doping said silicon dioxide mobile ion transport layer further comprises annealing said semiconductor substrate after subjecting said silicon dioxide mobile ion transport layer to said solution containing mobile ions.

18. The method of claim 15 wherein the step of doping said silicon dioxide mobile ion transport layer comprises implanting ions into said silicon dioxide mobile ion transport layer.

19. The method of claim 15 wherein the step of doping said mobile ion transport layer comprises depositing a layer containing mobile ions over said mobile ion transport layer openings and annealing said semiconductor substrate.

20. The method of claim 15 wherein said mobile ions comprises sodium ions.

21. The method of claim 15 wherein said trapping sites comprise chlorine.

* * * * *